US 6,555,997 B1

United States Patent
De Vries et al.

(10) Patent No.: US 6,555,997 B1
(45) Date of Patent: Apr. 29, 2003

(54) ELECTRICITY METER AND AN INPUT MODULE FOR AN ELECTRICITY METER

(75) Inventors: Jacob De Vries, Allenwinden (CH); Michel Schaller, Baar (CH); Erich Jeker, Baar (CH)

(73) Assignee: Landis+Gyr AG, Zug (CH)

( * ) Notice: Subject to any disclaimer, the term of this patent is extended or adjusted under 35 U.S.C. 154(b) by 0 days.

(21) Appl. No.: 09/787,147

(22) PCT Filed: Sep. 13, 1999

(86) PCT No.: PCT/EP99/06771

§ 371 (c)(1),
(2), (4) Date: Mar. 14, 2001

(87) PCT Pub. No.: WO00/16109

PCT Pub. Date: Mar. 23, 2000

(30) Foreign Application Priority Data

Sep. 15, 1998 (DE) .......................... 198 42 241

(51) Int. Cl.[7] ............................................. G01R 11/32
(52) U.S. Cl. ..................... 324/74; 324/142; 324/158.1
(58) Field of Search ............................... 324/141, 142, 324/117 H, 140 R, 74, 158.1; 702/60, 85, 61

(56) References Cited

U.S. PATENT DOCUMENTS 5,170,115 A * 12/1992 Kashiwabara et al. ...... 324/142
5,349,676 A    9/1994 Garverick et al.
5,544,089 A * 8/1996 Hemminger et al. .......... 702/64
6,020,734 A * 2/2000 Grisham et al. ........ 324/103 R
6,058,354 A * 5/2000 Adame et al. ........... 324/117 H
6,341,135 B1 * 1/2002 Fawal et al. ................ 327/108

FOREIGN PATENT DOCUMENTS

| CH | 683579 A5 | 3/1994 |
| CH | 687423 A9 | 11/1996 |
| DE | 195 26 723 C1 | 2/1997 |
| EP | 0 887 650 A1 | 12/1998 |
| GB | 2 167 619 A | 5/1986 |

* cited by examiner

Primary Examiner—Kamand Cuneo
Assistant Examiner—Tung X. Nguyen
(74) Attorney, Agent, or Firm—Maginot, Moore & Bowman

(57) ABSTRACT

In order to obtain a simple construction of an electricity meter (1), the invention provides that the meter comprises a highly integrated input module (3a, 3b, 3c) in which an analog-digital converter (5a, 5b) and an output module (7a) are integrated. A multiplying means (21) can optionally be integrated. Such an input module (3a, 3b, 3c), in combination with conventional components, especially microprocessors, makes it possible to produce an electricity meter which comprises a simple construction and which is of a single-phase and multi-phase type (also for a plurality of consumers).

9 Claims, 4 Drawing Sheets

ELECTRICITY METER AND AN INPUT MODULE FOR AN ELECTRICITY METER

FIELD OF THE INVENTION

The invention concerns an electricity meter and an input module for an electricity meter.

The invention concerns an electricity meter as set forth in the classifying portion of claim 1 and an input module for an electricity meter, as set forth in the classifying portion of claim 10.

BACKGROUND OF THE INVENTION

CH 687 423 A5 discloses an electricity meter, in particular a multi-function meter, in which a respective measuring unit is provided for each phase. Current and voltage of the respective phase are fed to the respective measuring units. Each measuring unit generates output pulses of a frequency which is proportional to the power value consumed in the phase in question. In accordance with one embodiment, the measuring units can be connected at the output side to a microcomputer by way of a bus structure. The measuring units each preferably have as the current sensor a Hall element with a voltage frequency converter connected on the output side thereof. The bus connection is preferably in the form of a standardised bidirectional bus connection, while the measuring units can also supply digitised instantaneous values of the associated phase load current and the associated phase voltage. Processing of the recorded measurement values is then firstly effected in the downstream-connected microcomputer. It is optionally also possible to arrange downstream thereof a further processing arrangement with CPU/processor and associated memories. Admittedly, those meters involve digital measurement value processing, but a specific or separate analog/digital converter is not used.

U.S. Pat. No. 5,349,676 discloses a digital electricity meter in which a respective $\Sigma\Delta$-modulator is provided as an analog/digital converter (A/D converter) for each measurement value to be detected (current or voltage). The digitised measurement values are then processed by means of two processors. The entire signal processing arrangement including A/D-converter, processors, memories and so forth are disposed on a common IC.

A similar arrangement is known from U.S. Pat. No. 5,544,089 and U.S. Pat. No. 5,631,843. In that case also A/D-converter, filter, memory and at least one processor are disposed on a common chip. The design configurations in the two publications last referred to suffer from the disadvantage that they only use special ICs which, by virtue of their high integration density, are expensive and are only directed to specific applications. Further digital electricity meters are known from DE 195 26 723 C1 and EP 0 887 650.

The object of the present invention is to provide an electricity meter and an input module which is suitable for same, wherein, starting from the use of standard processing modules and components, optimum integration is to be implemented in terms of pre-processing and detection of the input signals.

SUMMARY OF THE INVENTION

Accordingly, taking the state of the art as the basic starting point, it is provided in accordance with the invention that the input module is in the form of a separate integrated circuit which is separate from the processing module and that provided as the multiplying means is a hardware multiplier which is integrated into the integrated circuit. Preferably the A/D converter is in the form of a sigma-delta-modulator ($\Sigma\Delta$-modulator) which is integrated into the integrated circuit.

That simple design configuration affords a modular structure for an electricity meter, wherein processor or computing modules which are available as standard can be used for digital data processing. By virtue of the simple design configuration of the input module, it can be produced inexpensively, in large numbers of items, whereby overall the electricity meter can be produced at low cost and with a low level of complication.

It is desirable if the input module has multiplying means for forming a power value. In that case, the multiplying means can advantageously be in the form of a hardware multiplier which is integrated into the integrated circuit. That avoids time-consuming computing procedures in the downstream-disposed processing module. The simplest case only involves providing for accumulation of the power values supplied by the hardware multiplier, in order to arrive at an energy consumption value.

Preferably, an input module is to be provided for each phase, in particular for three phases, of a consumer or the network to be connected to the electricity meter. The modular nature of the input portion of the electricity meter thus affords simple adaptation to the required number of phases. It is also possible to provide a multiplicity of input modules, which multiplicity is subdivided into groups, with each group being associated with a respective consumer. In that way it is in effect possible to put together a multiple measuring arrangement, in which case the energy consumptions of different consumers or loads can be detected by means of a central processing arrangement.

It is desirable if a current sensor which includes at least one Hall element is provided for each input module. A current sensor of that kind can be easily integrated into the input module, with the amount of space required being small. It will be appreciated that alternatively it is also possible to use other kinds of current sensors, for example a field sensor, a magnetoresistive bridge, a sensor with shunt or a conventional current converter on a magnetic basis.

Preferably the connection between the input module or modules and the processing module is in the form of a bus connection, in which case for that purpose each input module has a bus coupler or interface module. In that way it is possible to provide for fast data transfer from the input module or modules to the processing module, which permits a high rate of data throughput with a high level of resolution. In that case data transfer can take place in parallel or serial mode.

A respective A/D converter can advantageously be provided for the analog current input and the analog voltage input. That affords separate signal processing in which mutual influencing is kept at a low level.

Alternatively, it is also possible to provide a common A/D converter with a multiplexer connected on the upstream side thereof. A design configuration of that kind can be easily implemented, with only a slight amount of circuitry expenditure and complication being required within the integrated circuit. In this embodiment, cross-talk is prevented between the channels for current and voltage, in comparison with an arrangement having two A/D converters.

It is desirable if each input module includes a memory in which parameters and/or operating settings and/or other data which can be set or which can be predetermined for operation are or can be stored. That means that a minimum of items of operating information can be stored in the processing module. For that purpose, it is possible to store separately for each processing module parameters which for example are already stored during manufacture and to which access may be made during operation in the installed condition. That concerns for example pre-settings or items of compensating information. There is therefore no need to load the memory resources of the processing module.

In accordance with the invention the object in regard to the input module is attained by a single-phase input module for an electricity meter that is in the form of an integrated circuit. The advantages set forth hereinbefore apply accordingly here. Input modules of that kind are suitable in particular for use in domestic meters or three-phase, of a single-phase or three-phase type.

BRIEF DESCRIPTION OF THE DRAWINGS

Embodiments of the invention, further advantages and details are described more fully hereinafter with reference to the drawing in which.

DETAILED DESCRIPTION

In the Figures hereinafter the same components are denoted by the same references or references which are at least in substance the same.

Figure 1:
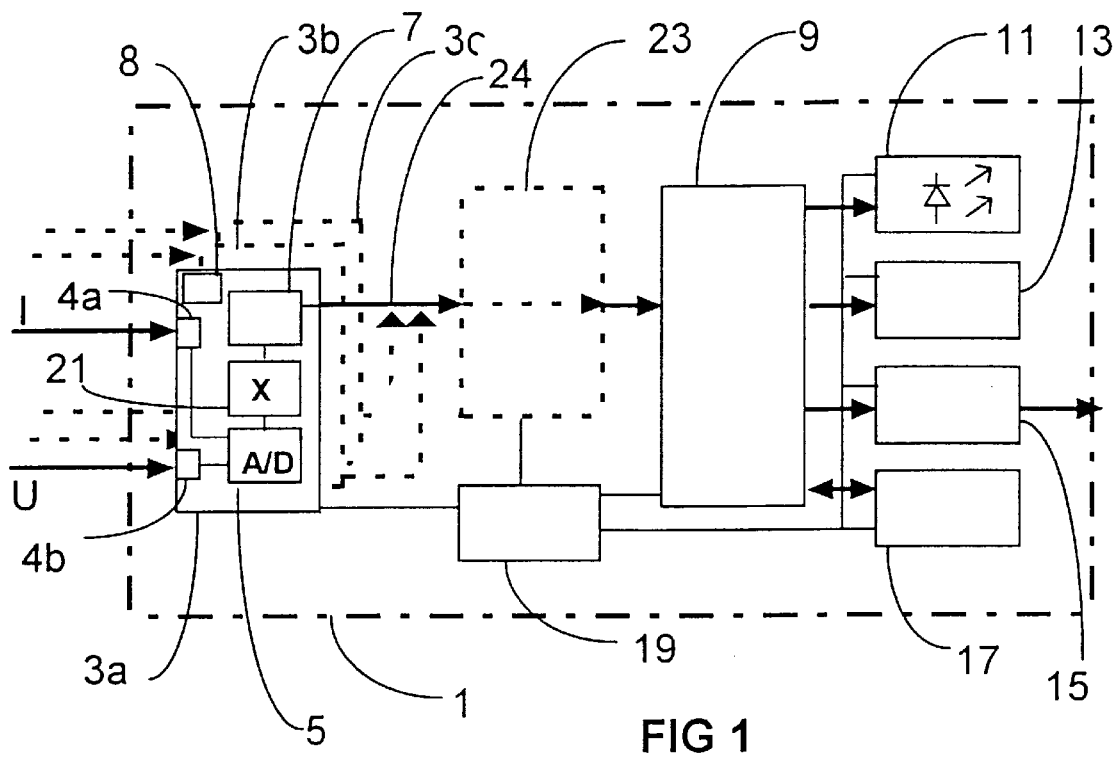
FIG. 1 shows a block circuit diagram for alternative embodiments of an electricity meter having one or more input modules.

FIG. 1 shows a block circuit diagram of an electricity meter 1 (referred to hereinafter as the meter 1). The meter 1 has an input module 3a to which are fed an analog current signal I and an analog voltage signal U (referred to hereinafter as the signals I and U respectively) of a consumer or load (not shown). The aim in this respect is to detect the energy consumption of the consumer.

For that purpose the input module 3a has an analog current input 4a and an analog voltage input 4b. By way of those inputs, the two signals I and U are fed to a signal converter means 5 which is in the form of an A/D converter and which produces digital values from the analog signals. The digital values of current and voltage I and U respectively are then passed by way of an output module 7 to a downstream-connected processing module 9.

The processing module 9 is in the form of a digital module and can be formed for example by a microcomputer, a computer or other commercially available processor. Data processing of the detected signal is implemented in the processing module 9, to form the desired energy consumption values. These can be any values which are formed in accordance with the state of the art and which can be formed generally by meters, for example active power, reactive power, maximum values, harmonic power, energy consumption and so forth. This does not involve a limitation to specific consumption values. Processing of the data in the processing module 9 is effected by means of one or more stored programs.

The ascertained energy consumption values or items of information are then outputted from the processing module 9 by way of any output modules or communication modules. These may be for example: a pulse output module 10 in the manner of a flashing display (for example with a light-emitting diode as shown in FIG. 1), in which case the respective flashing pulses represent a predetermined energy value, a display 13 for displaying the various values, and/or a communication module 15, by way of which, in the manner of an interface, data can be transmitted to further processing arrangements. It will be appreciated that it is also possible to provide an input means (not shown), for example a keyboard or an operating panel, which for example can be formed in a structural unit with the display 13.

A memory module 17 can optionally also be associated with the processing module 9, if not indirectly associated or integrated therewith, in which the program or programs for data processing and for operation or other items of information for operation of the meter 1 can be stored. In that case, the memory module 17 may include in particular a non-volatile memory, for example an ROM or EEPROM, for the permanent storage of data. It will be appreciated that, for the general operation of the meter 1, it has as the energy supply a mains power supply unit 19 which supplies electrical energy to the respective hardware components by way of lines (not shown).

The above-described embodiment of the meter 1 serves by way of example for a so-called single-phase meter. Based on a modular structure for the input module 3a, in which the output module 7 is in the form of a bus coupler or interface, a cascade arrangement or multiplication of input modules is also a possibility. For that purpose, the Figure shows in broken line further optional input modules 3b and 3c which are connected in parallel to the input module 3a by way of their respective output modules (not shown) and a bus connection 24. Multi-phase configurations of the meter 1 can be implemented in that way. It will be appreciated that, for such an arrangement, the phase voltages and currents of the other phases are preferably to be fed in phase relationship to the respective input modules 3b and 3c respectively. In that case the input modules 3a through 3c may also be referred to as so-called 'Front End Modules'.

A plurality of groups of input modules may also optionally be connected together in such a way that energy consumptions of various loads or consumers can be detected with a common meter, in particular a common processing module 9. That makes it possible to embody a simple modular structure at a low level of technical expenditure for multiple energy detection. For example, the meter 1 illustrated in FIG. 1 could be used to detect the energy consumptions of three single-phase consumers (or, with a plurality of input modules, even more consumers). Other signals, for example a temperature or a pulse signal can also be detected with an input module of that kind.

The input module 3a can preferably also include a multiplying means for forming a power value W. Preferably, the multiplying means 21 is a hardware multiplier or a multiplier module. In that way, it is possible to produce for each input module 3a, 3b and 3c a respective power value which can be passed together with current and voltage data to the processing module 9. That means that the computing procedure in the processing module 9 is considerably reduced, whereby other functions or previous functions can be executed more quickly.

It is essential in terms of the structure of the illustrated meter 1 that the entire input module 3a (or 3b or 3c respectively) is in the form of a separate integrated circuit which is separated from the processing module 9. That therefore affords a so-to-speak decentral modular structure which permits a simple design of the most widely varying alternative meter configurations with components which are in principle the same or standard. High numbers of items can be achieved by the use of the same integrated input module for single-phase and multi-phase meters, whereby the input module 3a becomes advantageous in terms of its manufacture.

The input module 3a may possibly also include a memory 8 for storing parameters and/or operating settings and/or other data required for operation, for example setting values, calibration values or constants.

In addition, it is possible to connect between the input module 3a and the processing module 9 a further processing module 23 which for example can be in the form of a digital signal processor. That permits simple data pre-processing, whereby it is possible to provide for optimum task distribution within the meter 1 in regard to slow or fast signal processing. Such a configuration can also be referred to as a dual-processor construction. The structure of the input module 3a will be discussed in still further detail in relation to the other Figures.

Figure 2:
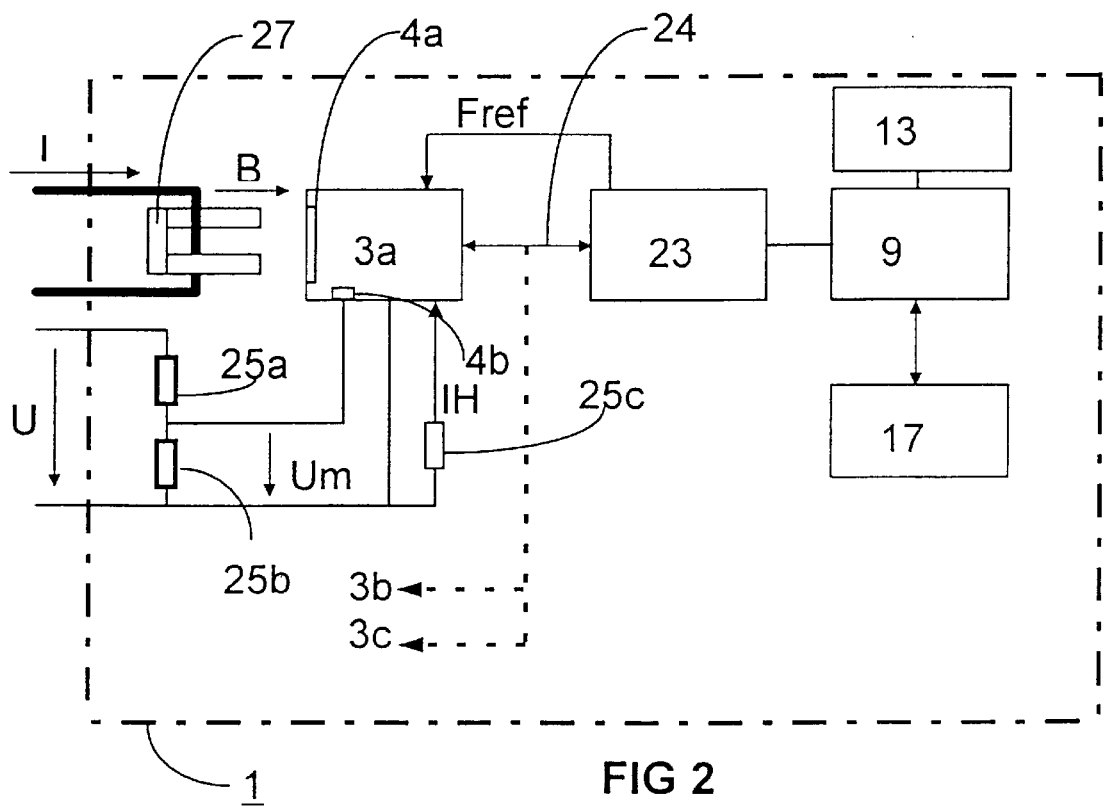
FIG. 2 shows a block circuit diagram relating to the circuitry of an input module as shown in FIG. 1.

FIG. 2 shows a meter 1 in a block circuit diagram in which the input region, in particular the external circuitry of the input module 3a, is described in greater detail. The meter 1 has a current sensor and a voltage sensor to detect current I and voltage U respectively. In the present case the voltage sensor is formed by a voltage divider which includes two resistors 25a and 25b. The voltage U which is tapped off at the consumer is divided with the voltage divider and fed as a measurement voltage Um to the input module 3a. The resistors 25a and 25b are preferably not components of the input module 3a and belong to its external circuitry. They can however also be arranged with the input module 3a on a common circuit board or printed circuit. That means that the input module 3a can be used for the most widely varying cases, with different voltages. In that case adaptation is effected in the respective situation of use by virtue of suitable selection of that circuitry.

The current signal I of the consumer is passed by way of a core 27 in the form of a magnetic field B to the input module 3a and is there converted by means of a conversion procedure into an electrical measurement signal. The current input 4a is in this case therefore in the form of a field input. Preferably, a Hall element (not shown here) which can also be integrated into the input module 3a is used for current detection purposes. That means that, with suitable dimensioning, the input module 3a can be easily inserted directly into an air gap of the core 27. It will be appreciated that as an alternative a core-less design configuration is also possible.

For operation of the input module 3a it may be necessary for a clock signal Fref to be fed thereto by the further processing module 23 or another device within the meter 1. Reference numeral 25c denotes a further resistor or reference resistor which serves to produce a reference current for the input module 3a, in particular as a field current IH for its Hall element. In this case, the field current IH is produced by applying to the reference resistor 25c a reference voltage which is available within the input module 3a.

Figure 3:
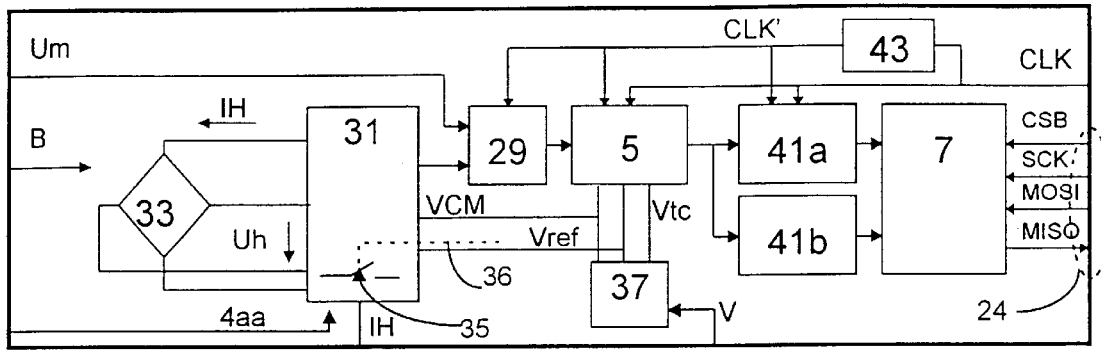
FIG. 3 shows a block circuit diagram relating to the internal structure of an input module.

FIG. 3 shows a more detailed structure of an input module 3a in which a common A/D converter is used for current I and voltage U, as the signal converter means 5. For that purpose, a multiplexer 29 is connected on the upstream side of the A/D converter 5. The measurement voltage Um is applied to an input of the multiplexer 29. In the present case, a Hall element 33 which detects the field B (produced by the current I) serves as the current sensor. An analog auxiliary circuit 31 is associated with the Hall element 33. The Hall element 33 and the analog auxiliary circuit 31 form so-to-speak the input region in respect of current detection. The reference or field current IH is fed to the Hall element 33 by the auxiliary circuit 31. The actual measurement signal Uh which is a current-proportional voltage is then fed to the auxiliary circuit 31 which then amplifies it for further processing. More detailed information regarding the auxiliary circuit 31 with the Hall element 33 is to be found in the general known state of the art, for example as disclosed in DE 37 02 344 A1 or DE 37 11 978 C2. In that respect, the Hall element 33 may optionally be in the form of a vertical or horizontal Hall element.

In addition or alternatively it is also possible to provide for current detection by means of a conventional current sensor, for example in the manner of a magnetic current converter or with a shunt. For that purpose the auxiliary circuit 31 has a current input 4aa to which a current I can be directly fed. In a universal design configuration of the auxiliary circuit 31, this may include for example controllable change-over switching means 35, by way of which the current detection mode which is respectively wanted can be switched on or predetermined by way of a signal input or by software.

In addition the input module 3a includes a reference voltage source 37. The reference voltage source 37 supplies two reference voltages: a temperature-stable voltage Vref and a temperature-dependent voltage Vtc. The temperature variation of the voltage Vtc corresponds to that of the Hall element 33. The voltage Vtc is used as a reference voltage for the A/D converter 5, whereby the temperature dependency of the Hall element 33 or its temperature variation is compensated. In addition, the reference voltage source 37 also supplies a reference voltage VCM which if necessary can be fed to the respective modules. The reference voltage source 37 can also include partial voltage sources or modules for producing the respective voltages. It will be appreciated that the input module 3a and the reference voltage source 37 are supplied with a voltage V by the mains network.

In the present case the A/D converter 5 is in the form of a ΣΔ-modulator (sigma-delta modulator). At the output side the modulator produces a digital signal in the form of a bit stream. In order to convert that bit stream into bit words, decimation filters 41a and 41b are connected on the output side of the A/D converter 5. They convert the serial information into parallel digital signals. The bit words produced are then transmitted by way of the bus module 7 which for example is in the form of a so-called interface or bus coupler to the downstream-connected processing module 9 (not shown in this Figure), by way of the bus connection 24. In addition the bit words are fed from the decimation filters 41a, 41b to a multiplying means 71 by way of that output module 7, for the purposes of power value formation. The multiplying means 71 is advantageously in the form of a hardware multiplier. For the functional description of the power value formation procedure, reference is made to FIG. 5 and FIG. 6 and the description hereinafter.

In operation the output module 7 exchanges the following signals with the processing module 9:

CSB Signal (Chip Select)

This CSB signal is fed to the input module 3a by way of a separate line and serves for selection or activation of the respective input module with which communication is to be made. That is particularly important in relation to uses with a plurality of input modules. SCK signal (shift clock/clock signal)

The SCK signal predetermines the clock for information transfer between the input module 3a and the processing module 9.

MOSI Signal (Master Out, Slave In)

With the MOSI signal, items of information, in particular commands, are transferred from the master, that is to say for example from the processing module 9, to the slave, that is to say the input module 3a.

MISO Signal (Master In, Slave Out)

The MISO signal applies similarly to the MOSI signal for the opposite direction of information transfer, that is to say from the input module 3a to the processing module 9, and serves essentially for data output.

Depending on the execution of the function of the A/D converter 5, it is also possible for an optional decimation filter 41b to be connected on the output side thereof, so that separate processing of the signals for current and voltage is possible. Signal processing can possibly be considerably accelerated in that way.

As already described above, a clock signal CLK is applied to the input module 3a by way of a line. The clock signal CLK is possibly passed by way of a divider module 43, whereby a lower clock frequency CLK' is produced. The clock signals CLK or CLK' are then fed to the respective components or modules in accordance with the respectively intended processing speed for the function thereof. That concerns in particular the multiplexer 29, the A/D converter 5 and the decimation filters 41a and 41b.

Figure 4:
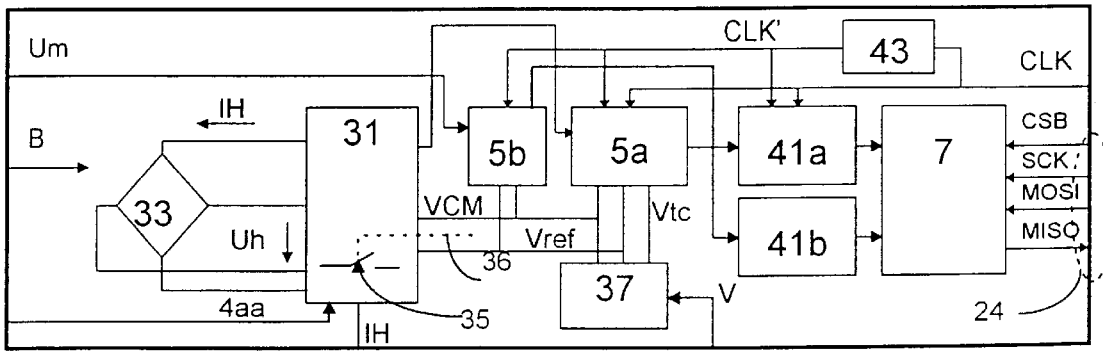
FIG. 4 shows an alternative embodiment relating to the internal structure of an input module.

FIG. 4 shows an alternative structure which does not employ a multiplexer 29. For that purpose, a separate A/D converter 5a and 5b respectively is provided for each of the current and the voltage. In that arrangement, a respective decimation filter 41a and 41b is associated with each of the A/D converters 5a and 5b. The rest of the structure corresponds in substance to FIG. 3. Optionally, minor adaptations are required for the purposes of better or faster signal processing, within the context of normal adaptation measures.

Supplemental to the Figures which have already been described above, FIG. 5 shows a diagram in respect of the signal flow within the meter 1 for single-phase signal processing. The current and voltage signals I and U respectively are firstly detected by sensor means 51 (Sensor & Front-End) and passed by way of the multiplexer 53 to an analog-digital conversion operation 55 ($\Sigma\Delta$). A reference voltage is supplied to the analog-digital conversion step 55 by the reference voltage source 37 (Reference Voltage). Then—separately for current I and voltage U—the corresponding data are subjected to filter processing in the decimation filters 57a and 57b respectively (Sinc3). In that case, bit words are formed for the respective data from a bit stream.

Phase correction 59 (Phase Compensation) can optionally be provided, in relation to the voltage U. That makes it possible to eliminate a phase difference between current and voltage, which is caused in particular by the multiplexer 53. The processing modules 61a and 61b serve for dc suppression (DC-Cancellation) and in terms of processing procedures are in the form of a high pass filter. Then, for each processing path (voltage or current), for the respective data sets, the procedure also involves processing steps for square formation 63a, 63b ($X^2$), accumulation or summing 65a, 65b ($\Sigma$) and calibration steps 67a, 67b (Calibration). Then, the processing modules 69a, 69b each execute calculation of the effective values Ieff and Ueff for current and voltage respectively, corresponding to the following formula:

$$\frac{1}{T}\sqrt{\Sigma x^2}.$$

As already described above, the input module 3a may additionally have multiplying means which in the present case are implemented by a multiplying module 71. Power values are formed by that multiplying step. To produce an energy value W, the procedure then also includes an accumulation or summing member 65c ($\Sigma$) and optionally a calibration member 67c (Calibration).

The dash-dotted line 70 encloses the elements, modules or processing steps which are preferably implemented within the input module 3a. In that case, the processing steps which are embraced by the bracket a are subject to fast signal processing. In this respect, the term fast denotes processing in the kHz-range, for example between 1 and 10 kHz, in particular about 2 kHz. The bracket b embraces the steps which involve relatively slow data processing which can be in the frequency range of between about 1 and 10 Hz, in particular between 1 and 4 Hz.

Figure 5:
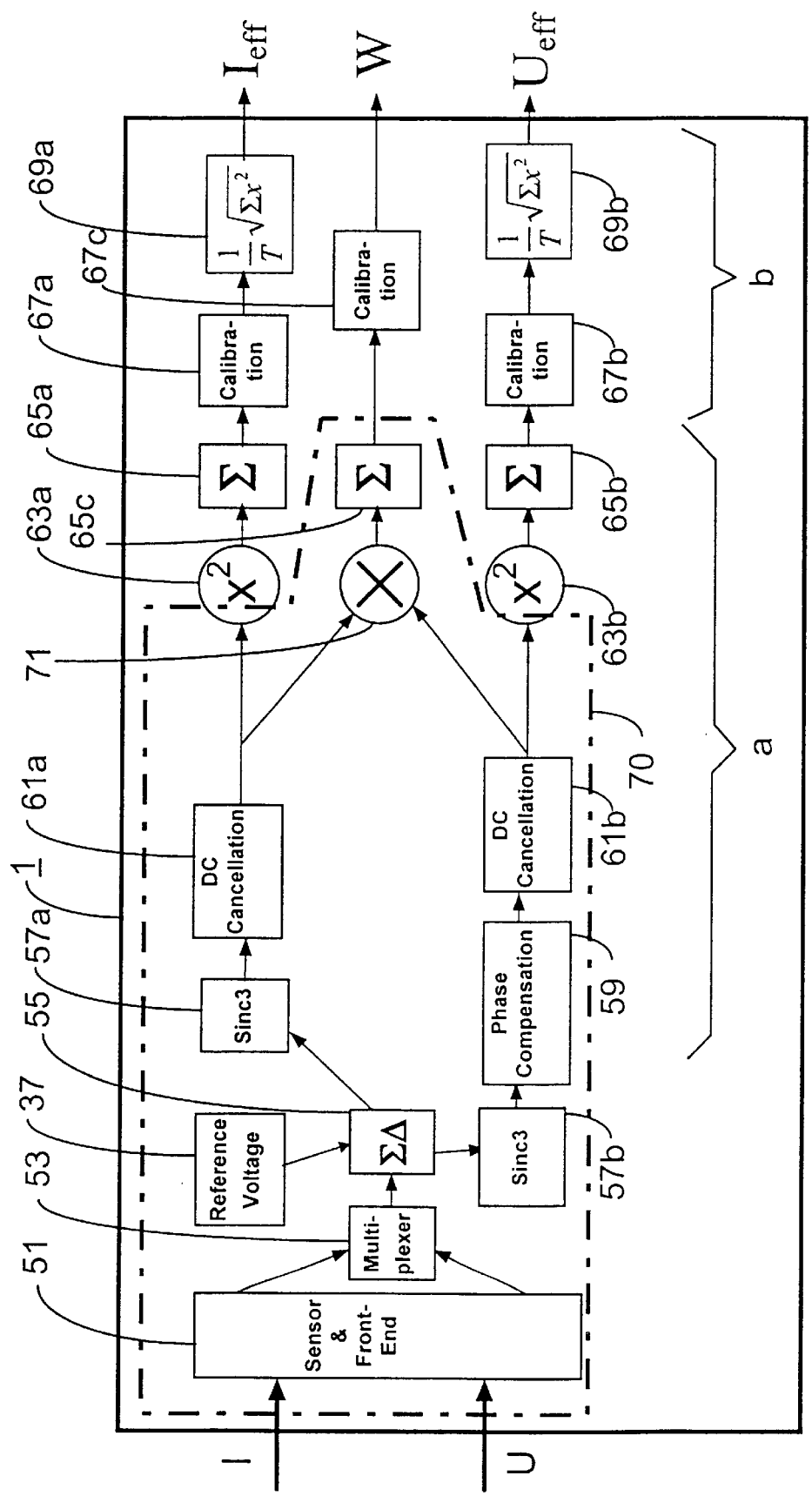
FIG. 5 shows a block circuit diagram relating to signal processing and the data flow of the electricity meter.
Figure 6:
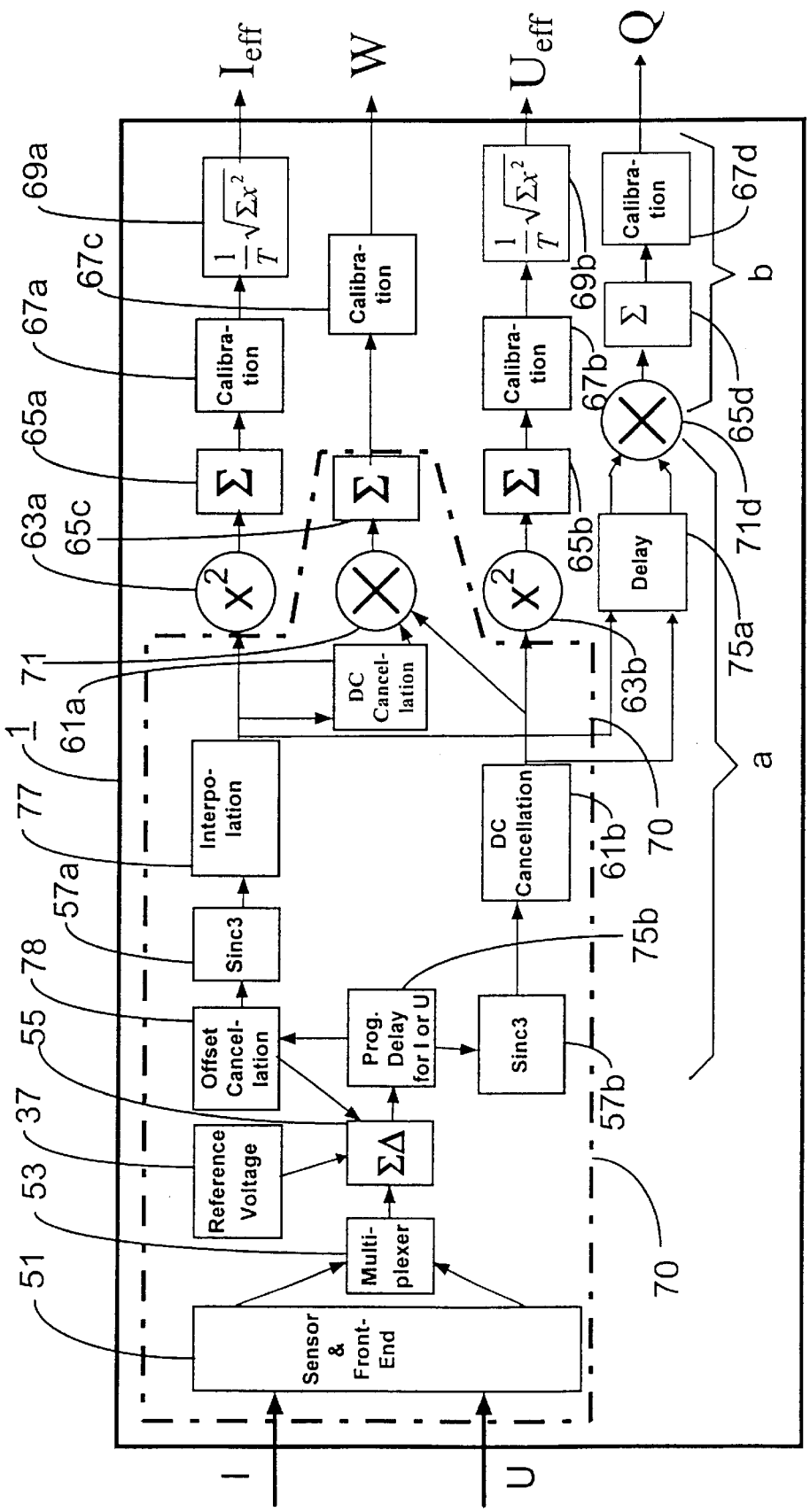
FIG. 6 shows an alternative embodiment to FIG. 5.

FIG. 6 shows a flow chart (substantially corresponding to that of FIG. 5) which involves processing steps for producing a reactive power value Q. The processing steps for that purpose are in principle to be interpreted as being similar to those involved in the production of the energy value W in FIG. 5. For that purpose, there is firstly provided a delay member 75a (Delay) with which the values current I and voltage U are delayed (in order to obtain the required phase shift for the reactive power). There then follows a multiplying module 71, an accumulation or summing member 65d ($\Sigma$) with subsequent calibration 67d (Calibration).

Unlike FIG. 5, processing steps are individually divided up differently or the procedure includes optional steps. There is no provision here for phase compensation in the voltage path. In addition however there is for example a delay device 75b with which an angular error in the sensor means 51 can be compensated. The procedure also involves an interpolation member 77 (Interpolation) and offset suppression 78 (Offset Cancellation). Offset suppression 78 makes it possible to correctly detect continuous or DC components in the current I and to take account thereof in terms of calculating the effective value (Ieff).

Essential ones of the processing components, modules or processing steps shown in FIGS. 5 and 6, after the A/D conversion operation, are to be interpreted in that respect as software modules or program steps within the context of digital signal processing. What is essential in regard to the present new idea is that there is provided a small, highly integrated input module which can be universally employed for the most widely varying uses. In that way, it is possible to have access to standard processors or digital signal processors, for subsequent signal processing. The structure of such a meter 1 is thereby made particularly simple and inexpensive. In that respect, only the input module is required as a special component for the meter 1, and that input module affords multiple use options, by virtue of its modular mode of use. A particularly reliable, inexpensive meter can be produced by virtue of combination with conventional processing modules.

In this respect the input module can be in the form of a small IC which for example in the form an SMD component can be soldered or mounted on a circuit board of a meter 1. For special uses, it is also conceivable that only partial functions (for example the generation of Ieff and Ueff) of the input module are used in a meter, as the input module is highly attractive by virtue of inexpensive manufacture thereof, when large numbers of items are involved. The other functions are then put out on to additional components.

What is claimed is:

1. A single-phase input module (3a, 3b, 3c) for an electricity meter (1) comprising:

an analog current input and an analog voltage input (4a, 4aa and 4b respectively), wherein said inputs are connected to a signal converter means (5, 5a, 5b, 55, 41a, 41b), which includes a ΣΔ-modulator (5, 5a, 5b, 55), and hardware multiplying means (21, 71) for forming a power value (W), characterised in that provided as the signal converter means (5, 5a, 5b, 55, 41a, 41b) is at least one analog/digital converter which includes the ΣΔ-modulator (5, 5a, 5b, 55) and at least one decimation filter (41a, 41b), the input module (3a, 3b, 3c) is in the form of an integrated circuit, and the hardware multiplying means (21, 71) is integrated into the integrated circuit and is connected on the output side of the analog/digital converter (5, 5a, 5b, 55, 41a, 41b).

2. An electricity meter (1) comprising at least one single-phase input module (3a, 3b, 3c) associated with a mains network phase, as set forth in claim 1, which input module (3a, 3b, 3c) has:

an analog current input and an analog voltage input (4a, 4aa and 4b respectively), wherein said inputs are connected to a signal converter means (5, 5a, 5b, 55, 41a, 41b) for current and voltage, the signal converter means including a ΣΔ-modulator (5, 5a, 5b, 55), and a hardware multiplier (21, 71) for forming a power value (W), characterised in that provided as the signal converter means (5, 5a, 5b, 55, 41a, 41b) is at least one analog/digital converter (5, 5a, 5b, 55, 41a, 41b) which includes the ΣΔ-modulator (5, 5a, 5b, 55) and at least one decimation filter (41a, 41b), the hardware multiplier (21, 71) is connected on the output side of the analog/digital converter (5, 5a, 5b, 55, 41a, 41b), and the input module (3a, 3b, 3c) with its hardware multiplier and analog/digital converter is in the form of an integrated circuit.

3. An electricity meter as set forth in claim 2 wherein a respective input module (3a, 3b, 3c) is proved for each phase of an associated consumer, in particular for three phases.

4. An electricity meter as set forth in claim 2 wherein there is provided a plurality of input modules (3a, 3b, 3c), said plurality being subdivided into groups, and wherein each group is associated with a respective consumer.

5. An electricity meter as set forth in claim 2 wherein there is provided for each input module (3a, 3b, 3c) a respective current sensor (51) which includes at least one Hall element (33).

6. An electricity meter as set forth in claim 2 wherein the connection between the input module or modules (3a, 3b, 3c) and the processing module (9) is in the form of a bus connection (24) and each input module (3a, 3b, 3c) has a bus coupler.

7. An electricity meter as set forth in claim 2 wherein a respective analog/digital converter (5a and 5b respectively) is provided for each of the analog current input and analog voltage input (4a and 4b respectively).

8. An electricity meter as set forth in claim 2 wherein for the analog current input and the analog voltage input (4a, 4aa and 4b respectively) there is provided a common analog/digital converter (5, 55), with a multiplexer (29, 53) connected on the input side thereof.

9. An electricity meter as set forth in claim 2 wherein each input module (3a, 3b, 3c) includes a memory in which parameters and/or operating settings and/or other data which can be set or which can be predetermined for operation can be stored.

* * * * *